United States Patent
Yamaji et al.

[11] Patent Number: 6,159,837
[45] Date of Patent: Dec. 12, 2000

[54] MANUFACTURING METHOD OF SEMICONDUCTOR DEVICE

[75] Inventors: Yasuhiro Yamaji; Eiichi Hosomi, both of Kawasaki, Japan

[73] Assignee: Kabushiki Kaisha Toshiba, Kawasaki, Japan

[21] Appl. No.: 09/354,271

[22] Filed: Jul. 15, 1999

[30] Foreign Application Priority Data

Jul. 16, 1998 [JP] Japan .................... 10-202117

[51] Int. Cl.⁷ .................................................. H01L 21/44
[52] U.S. Cl. .................... 438/613; 438/614; 438/617
[58] Field of Search .................................. 438/613, 614, 438/617

[56] References Cited

U.S. PATENT DOCUMENTS

| | | | |
|---|---|---|---|
| 5,143,865 | 9/1992 | Hideshima et al. | 437/183 |
| 5,668,405 | 9/1997 | Yamashita | 257/668 |
| 5,757,078 | 5/1998 | Matsuda et al. | 257/737 |
| 5,789,142 | 8/1998 | Brown | 430/315 |
| 5,883,435 | 3/1999 | Geffken et al. | 257/758 |
| 5,895,229 | 4/1999 | Carney et al. | 438/106 |
| 5,946,590 | 8/1999 | Satoh | 438/613 |
| 6,022,757 | 2/2000 | Andoh | 438/106 |
| 6,028,011 | 2/2000 | Takase et al. | 438/613 |
| 6,028,357 | 2/2000 | Moriyama | 257/737 |

FOREIGN PATENT DOCUMENTS

| | | |
|---|---|---|
| 9-82850 | 3/1997 | Japan . |
| 9-172036 | 6/1997 | Japan . |
| 2830351 | 9/1998 | Japan . |

*Primary Examiner*—Jey Tsai
*Assistant Examiner*—Lynne A. Gurley
*Attorney, Agent, or Firm*—Finnegan, Henderson, Farabow, Garrett & Dunner, L.L.P.

[57] ABSTRACT

In this manufacturing method of a semiconductor device, after an electrode pad is formed on a surface of a semiconductor substrate, on this surface where the electrode pad is formed, except for on the electrode pad an insulating protective film is formed, then a layer of barrier metal covering the electrode pad is formed. Subsequently, a covering layer of curable resin having a hole exposing at least a part of the layer of barrier metal is formed on a semiconductor substrate. Then, the hole of the covering layer of curable resin is filled by conductive material and on the filled portion a protrusion is formed. Finally, these filled and protruded portions are exposed to heat treatment to form a protruded electrode for external connection. Thus, a semiconductor device having a protruded electrode that is high sufficiently, can be manufactured. Thermal stress does not concentrate at joint portion with the semiconductor substrate, and semiconductor device is highly reliable. In addition, the semiconductor device is reduced in bending or prevented from bending, resulting in easy mounting.

16 Claims, 4 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device that is mounted, for example, in face-down on a printed wiring board and more particularly to a manufacturing method of a semiconductor package that has an approximately identical size as a semiconductor chip.

2. Description of Related Art

When a semiconductor chip is mounted on a printed wiring board to constitute an electronic device, so called high density mounting is demanded to mount more semiconductor chip in a definite area. In order to realize this high density mounting, a CSP (Chip Scale Package or Chip Size Package) that has an approximately identical size as a semiconductor chip is developed.

However, when a CSP is manufactured, for each semiconductor chip that is cut out of a wafer, an assembling is required. Accordingly, there is a problem that manufacturing process becomes complicated.

To cope with such a problem, a method is proposed in which after assemblage of a device on a wafer, this semiconductor device is cut out of the wafer. For example, in Japanese Patent Laid-open Publication (KOKAI) No. Hei 9-172036, a manufacturing method of CSP that comprises a step of printing paste of conductor on a semiconductor chip to form a protruded electrode (bump), and a step of coating insulating material on a surface of the semiconductor chip other than on the protruded electrode to form a sealed body is disclosed.

In general, in order to mount a semiconductor device such as a CSP on a printed wiring board or the like, electrodes are formed on the wiring board corresponding to bumps of the semiconductor device, and the bumps are pushed to contact to this electrode pattern, and thereafter the pushed portions are heated and melted to connect.

A semiconductor chip and a printed wiring board being used for CSP are largely different in their values of thermal expansion coefficient. Accordingly, when heat during mounting or heat cycle during use is added, due to difference of the thermal expansion coefficient stress concentrates on joint portion of the bump. Thereby, the joint portion tends to peel or to be high in electrical resistance. Thermal stress that is generated at the joint portion of the bump, by raising a height of bump, can be alleviated.

However, in a method that is disclosed in Japanese Patent Laid-open Publication (KOKAI) No. Hei 9-172036, a height of bump can not be sufficiently raised. That is, in this method, paste of conductor is coated by the use of screen printing method on an electrode pad of a semiconductor chip to form a protruded electrode (bump). By a thickness of a mask (metallic mask) during screen-printing, the height of the bump is determined. In the case of metallic mask, a ratio of thickness to diameter of opening can not be made so large. Accordingly, a bump that is sufficiently high for alleviating thermal stress could not be formed.

In addition, in the aforementioned manufacturing method of CSP, on a surface of a semiconductor chip other than on the electrode portion, a film of curable resin is coated. Since thermal expansion coefficient of the film is larger than that of the semiconductor chip, during letting cool naturally the film after heat treatment, thermally shrinking force of the film is restricted by the semiconductor chip to generate thermal stress. As a result of this, the semiconductor device bends toward the film to induce disturbance in mounting on a printed wiring board or the like.

SUMMARY OF THE INVENTION

The present invention is carried out to solve such problems accompanying the conventional method. An object of the present invention is to provide a manufacturing method that can form a protruded electrode (bump) having a sufficient height for alleviation of thermal stress, accordingly that is capable of connecting without concentrating thermal stress and with high reliability.

Another object of the present invention is to provide a method of manufacturing semiconductor devices that alleviate bending of the semiconductor device and prevent it from occurring, and are easy to mount on a wiring board.

The first aspect of the present invention is relating to a manufacturing method of a semiconductor device. The manufacturing method comprises:

a step of forming an electrode pad on a surface of a semiconductor substrate where a semiconductor element area is formed;

a step of forming an insulating protective film on the surface of the semiconductor substrate except for on the electrode pad;

a step of forming a layer of barrier metal that covers the electrode pad;

a step of forming a covering layer consisting of curable resin that has a hole for exposing at least a part of the layer of barrier metal on the surface of the semiconductor substrate;

a step of filling conductive material into the hole of the covering layer of curable resin, and forming a protrusion consisting of conductive material on the filled portion, and a step of heating at least the protruded portion to form a protruded electrode for external connection.

The second aspect of the present invention is a manufacturing method of a semiconductor device. The manufacturing method comprises:

a step of forming an electrode pad on a surface of a semiconductor substrate where a semiconductor element area is formed;

a step of forming an insulating protective film except for on the electrode pad on the surface of the semiconductor substrate where an element area is formed;

a step of forming a lead pattern consisting of a metal having barrier property at least a part of which is connected to the electrode pad;

a step of forming a covering layer consisting of curable resin that has a hole for exposing at least a part of the lead patter on the surface of the semiconductor substrate;

a step of filling conductive material into the hole of the covering layer of curable resin, and forming a protrusion consisting of conductive material on this filled portion; and a step of heating at least the protruded portion to form a protruded electrode for external connection.

When a lot of semiconductor devices are formed on a wafer (a semiconductor substrate), each step of the present invention is carried out simultaneously for the respective semiconductor devices.

In the present invention, as insulating protective film to be formed on a surface of a semiconductor substrate where a semiconductor element area is formed, for example, a passivation film of a thickness of approximately several μm consisting of silicon nitride (SiN) can be employed.

A layer of barrier metal is disposed with an object to prevent mutual diffusion between materials from occurring and to improve contacting property or the like. In the present invention, a layer of barrier metal is a layer of conductive metal or alloy that does not form brittle intermetallic compound due to contact with molten low melting metal when an electrode is formed by the use of low melting metal such as solder. For example, each layer of Ti/Ni/Pd is stacked to use. Further, a lamination of thin films of Cr and copper can be employed.

In the second aspect of the present invention, when lead pattern consisting of a metal having barrier property (barrier metal) is formed, to improve contacting property, a layer of adhesive resin is formed on an insulating protective film, and thereon lead pattern of barrier metal is preferable to be formed.

As curable resin for forming a covering layer on the layer or lead pattern of barrier metal, polyimide based resin or epoxy based resin can be preferably employed. As polyimide based resin, polyimide resin, polyimide resin copolymer such as polyester-imide resin and polyamide resin can be employed. In general, varnish of polyimide based resin is obtained by dissolving polyamide-acid that is a precursor of polyimide in an organic solvent. This varnish, after coated by the use of, for example, screen-printing method, is exposed to heat treatment and thereby amide acid part thereof induces dehydrocyclization reaction to form imide base.

A thickness of a covering layer of such curable resin is approximately 25 to 100 μm. This layer functions as a buffering layer to alleviate stress exerted on a bump for external connection and has a function to raise the height of an electrode. By holding a semiconductor device separated from a printed wiring board for mounting, electrical performance, particularly capacitance property can be improved. When a thickness of a covering layer of curable resin is less than 25 μm, stress alleviation effect is small, in contrast, when it is more than 100 μm, the semiconductor substrate deflects due to shrinking force during curing of the covering layer. By forming such a hole of a covering layer of curable resin with inverse taper getting wider towards an opening edge, filling operation of conductive material into the hole of that will be described later, can be carried out more easily. Further, the covering layer of curable resin is not restricted to only one layer, but may be constituted by stacking a plurality of layers of different curable resins.

In this time, in a surface of a semiconductor substrate, on an area where any electrode pattern does not exist, along a cutting line (dicing line) of the device, a portion where a covering layer of curable resin does not exist is formed with a prescribed width. Thereby, warp generation during heat treatment can be effectively suppressed. The portion where the covering layer of curable resin does not exist may be disposed on other area of a surface of a semiconductor substrate.

In the present invention, when a position of an electrode pad formed on a semiconductor substrate and a position of an electrode for external connection for connecting with a wiring board for mounting are coincided or approximately coincided, in the first aspect, after a layer of barrier metal is formed to cover the electrode pad, a covering layer of curable resin having a hole that exposes at least a part of this layer of barrier metal is formed. However, when a position of an electrode pad and a position of an electrode for external connection are not coincided, in the following way, an electrode pad and an electrode for external connection are connected electrically.

That is, on an insulating protective film formed on a surface of a semiconductor substrate, lead pattern is formed by a metal having a barrier property. The lead pattern is extended from an electrode pad to a position where an electrode for external connection is formed. Incidentally, this lead pattern may be a part of other circuit pattern.

Thereafter, so as to form a hole on a position where an electrode for external connection is formed, on the lead pattern, a covering layer of curable resin is formed by the use of screen printing method or the like. Thus, on the prescribed position of lead pattern a hole is disposed. Accordingly, by forming an electrode for external connection in this hole, the electrode for external connection and an electrode pad are electrically connected through lead pattern.

As conductive material that, in addition to filling the hole of the covering layer of curable resin, forms thereon a protrusion, paste of composite (paste of low melting metal) including powder of low melting metal is preferably employed. However, it is not restricted only to this, but for example powder of low melting metal can be employed alone.

As a method for forming an electrode for external connection in the hole of the covering layer of curable resin, there are methods carrying out in one step and in two steps.

In a method carrying out in one step, after disposing a metallic mask for electrode formation on a covering layer of curable resin, conductive material such as paste of low melting metal is disposed on a metallic mask. Then, by the use of a squeegee (compression type squeegee), this conductive material is filled in a hole of covering layer of curable resin and an opening of a metallic mask, respectively, to form at the same time filled portions and protrusions thereon.

In a method carrying out in two steps, first, conductive material such as paste of low melting metal is disposed on a mask disposed on a covering layer of curable resin. This conductive material is filled into a hole by the use of squeegee. Then, this filled portion is heated to melt or as it is, thereon a metallic mask for electrode formation is disposed. Thereafter, on this metallic mask, conductive material identical as the material filled in the hole or different conductive material is disposed, and this is filled in the opening of the metallic mask by the use of squeegee. Then, a protruded electrode portion is formed and this protruded portion is heated to a high temperature to reflow to form a bump.

Since the former method can be carried out in one step, workability is excellent. In the latter method, since volume reduction of the conductive material due to heating and melting can be compensated in the second screen-printing step, an electrode for external connection of sufficient height can be obtained, and in addition dimension accuracy is excellent.

As described above in detail, according to the present invention, in addition to simplification of manufacturing process, a height of protruded electrode (bump) for external connection of a semiconductor device can be made higher, thereby thermal fatigue life during packaging to a wiring board and during use can be improved.

DETAILED DESCRIPTION OF THE PREFERRED EMBODIMENTS

In the following, preferred embodiments of the present invention will be described.

Incidentally, in the following embodiments, a semiconductor substrate is a wafer, and thereon a lot of independent rectangular semiconductor elements that are omitted from showing in the figure are formed in matrix. A structure that is described in the following is shown as a representative of one that is formed on one semiconductor element among them. The steps shown in the following are common to the respective semiconductor elements and are carried out simultaneously.

FIG. 1A to FIG. 1C and FIG. 2A to FIG. 2B are diagrams showing cross-sections for explaining a manufacturing method of a semiconductor device that is a first embodiment of the present invention, respectively.

Figure 1A:
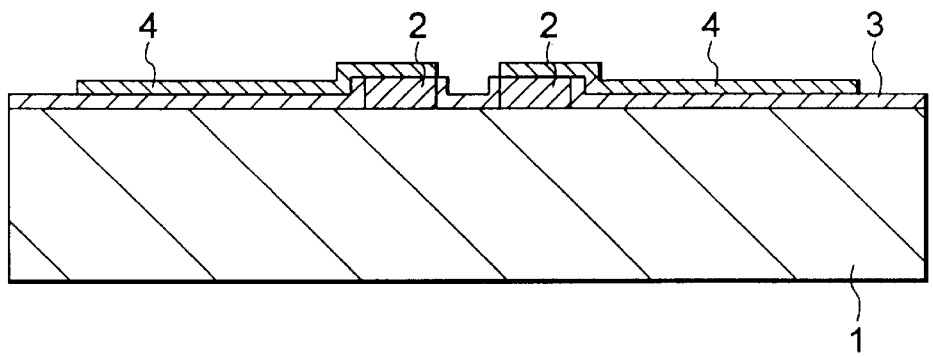
FIG. 1A, FIG. 1B and FIG. 1C are cross sections schematically showing each step up to a step of filling conductive material in a first embodiment of the present invention.

First, as shown in FIG. 1A, on a surface of a semiconductor substrate 1 where a semiconductor element area is formed, an electrode pad 2 consisting of metal such as aluminum or the like, together with other circuit pattern (omitted in the figure), is formed by the use of known photolithography technology. Incidentally, metal that constitutes electrode pad 2 is only necessary to be a conductor excellent in contacting property with underlying material. Other than metal mainly consisting of aluminum, metal mainly consisting of copper or gold can be employed.

Then, on a surface of such a semiconductor substrate 1, on an area except for on the electrode pad 2, by the use of method such as plasma CVD (Plasma Chemical Vapor Deposition) method, an insulating protective film 3 consisting of silicon nitride (SiN) is formed. This insulating protective film 3 covers a circuit pattern (not shown in the figure) that connects to an electrode pad 2.

Thereafter, a layer of barrier metal covers the electrode pad 2. As a layer of barrier metal, the respective layers of Ti/Ni/Pd are stacked to use. Then, after the layer of barrier metal is formed over from on the electrode pad 2 to on the insulating protective film 3, the layer that is formed on the insulating protective film is patterned to form a lead pattern 4 of barrier metal.

Figure 1B:
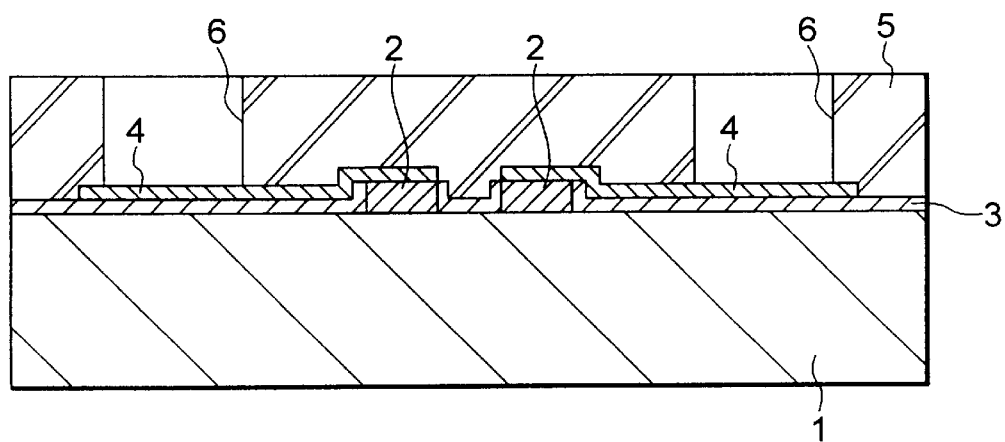

Next, as shown in FIG. 1B, on the lead pattern 4 of barrier metal and the insulating protective film 3, a covering layer 5 of curable resin having a thickness of 40 $\mu$m is formed by the use of screen-printing method. The covering layer 5 of curable resin is preferable to be formed with a thickness of 25 to 100 $\mu$m. When carrying out printing, in order not to form the curable resin layer, on a position where a hole 6 is to form, a screen mask is disposed. Then, after curable resin such as polyimide is filled into an opening portion (through hole) of the screen mask by the use of squeegee, the curable resin is cured. Thereby, a surface of semiconductor substrate 1 is covered by curable resin and at the prescribed position of the covering layer 5 of curable resin, a hole 6 is formed.

Figure 1C:
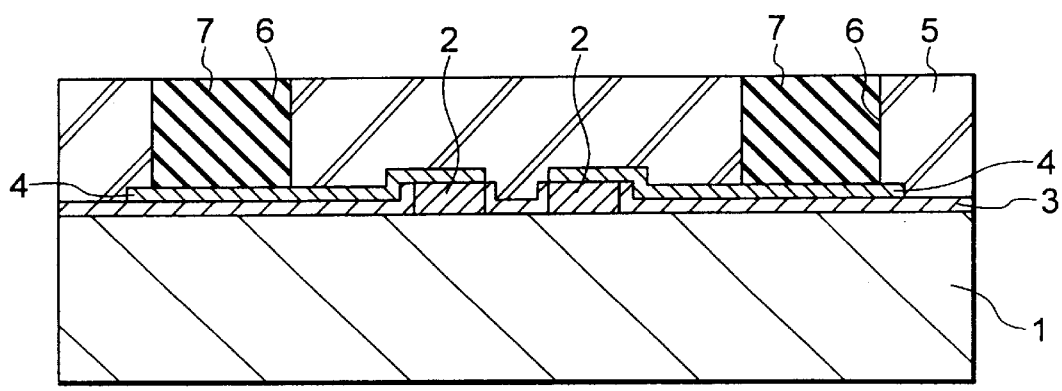

Then, as shown in FIG. 1C, in the hole 6 of the covering layer 5, paste of low melting metal such as eutectic solder (paste of eutectic solder) is filled by the use of screen-printing method. Thereby, a lead portion 7 of electrode connected to the lead pattern 4 of barrier metal is formed.

Figure 2A:
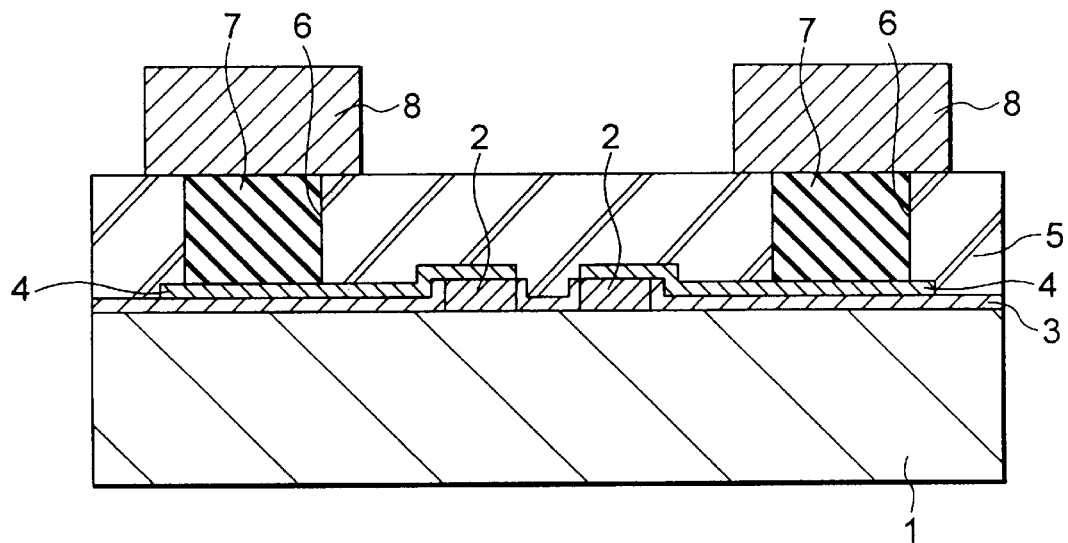
FIG. 2A and FIG. 2B are cross sections showing schematically a step of forming a protruded portion and a step of heat treating the filled portion and the protruded portion, respectively, in the same first embodiment.

Then, as shown in FIG. 2A, a bump portion (protruded portion) 8 of electrode is formed on the lead portion 7 of electrode by printing paste of eutectic solder by the use of screen-printing method. At this time, a metallic mask is disposed on the covering layer 5 of curable resin so that an opening portion thereof is piled up on the lead portion 7 of electrode. Further, for stabilization of the bump portion 8 of electrode, it is desirable to dispose a metallic mask having an opening of diameter larger than that of the lead portion 7 of electrode and to form the bump portion 8 of electrode of larger diameter than that of the lead portion 7 of electrode.

Figure 2B:
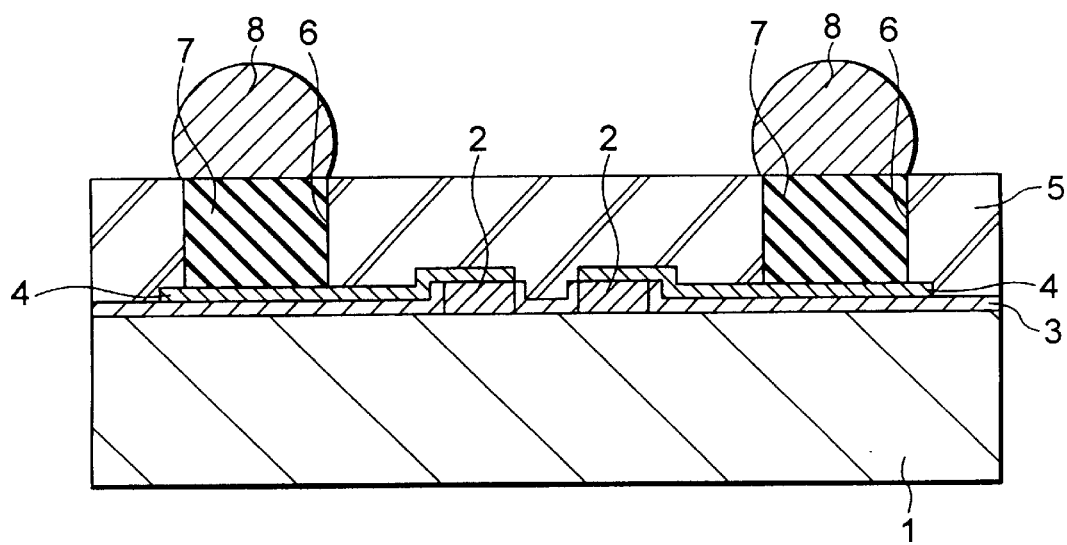

Thereafter, as shown in FIG. 2B, the lead portion of electrode 7 and the bump portion 8 of electrode are heated to melt to make the bump portion 8 of electrode spherical due to surface tension of eutectic solder. Thereby, a protrusion of an electrode for external connection protruded from the covering layer 5 of curable resin is formed.

Finally, the semiconductor substrate 1 is diced into each semiconductor chip. Thus, semiconductor devices are manufactured.

In the first embodiment, by filling paste of eutectic solder by the use of screen-printing method into a hole 6 of a covering layer 5 of curable resin, a lead portion 7 of electrode is formed. By further repeating similar screen-printing of paste of eutectic solder on the lead portion 7 of electrode, the bump portion 8 of electrode is formed. Accordingly, in addition to a height of electrode formed by screen-printing method (height of bump portion 8 of electrode), by of height of the lead portion 7 of electrode that corresponds to a thickness of the covering layer 5 of curable resin, height of electrode for external connection as a whole can be heightened. Accordingly, thermal stress exerting on the semiconductor chip and the bump portion 8 of electrode can be alleviated.

According to the first embodiment, electrodes or the like are formed on a semiconductor substrate of state of wafer and finally the semiconductor substrate 1 is diced into the respective semiconductor chips to manufacture semiconductor devices. There is no need to assemble each semiconductor chip cut out of the semiconductor substrate 1 and manufacturing process of semiconductor device can be simplified. In addition, a step of forming a covering layer 5 of curable resin on a surface of a semiconductor substrate 1 is carried out by the use of screen-printing method. Accordingly, reduction of manufacturing cost and manufacturing process is made possible.

Further, in a manufacturing method of the first embodiment, a lead pattern 4 of barrier metal is formed over from on an electrode pad 2 to on an insulating protective layer 3, and on the lead pattern 4 formed on an insulating protecting layer 3, to form a lead portion 7 of electrode, a hole 6 of a covering layer 5 is formed. Accordingly, degree of freedom as to places to dispose electrode increases. Further, in spite of size of an electrode pad 2, due to area of a portion of lead pattern 4 that is exposed from a hole 6 of a covering layer 5, an area of contact with the lead portion 7 of electrode can be varied. Thereby, electrical connection between a lead pattern 4 of barrier metal and a lead portion 7 of electrode can be secured.

In the aforementioned embodiment, a step of covering a surface of a semiconductor substrate 1 by curable resin is carried out by the use of screen-printing method. However, this step may be implemented by the use of another covering method.

Further, in a state where a metallic mask is disposed on a covering layer 5 of curable resin, with a compression type squeegee, paste of eutectic solder can be filled at once in a hole 6 and an opening of the metallic mask to form simultaneously a lead portion 7 of electrode and a bump portion 8 of electrode. According to a method that carries out steps of filling into a hole 6 and forming a protrusion simultaneously, a manufacturing process of semiconductor device can be further simplified.

Next, a second through fifth embodiments will be explained based on the respective drawings.

Incidentally, in these embodiments, points of which description only repeats that of the first embodiment are omitted from repeating, and points different from the first embodiment will be mainly described.

Figure 3:
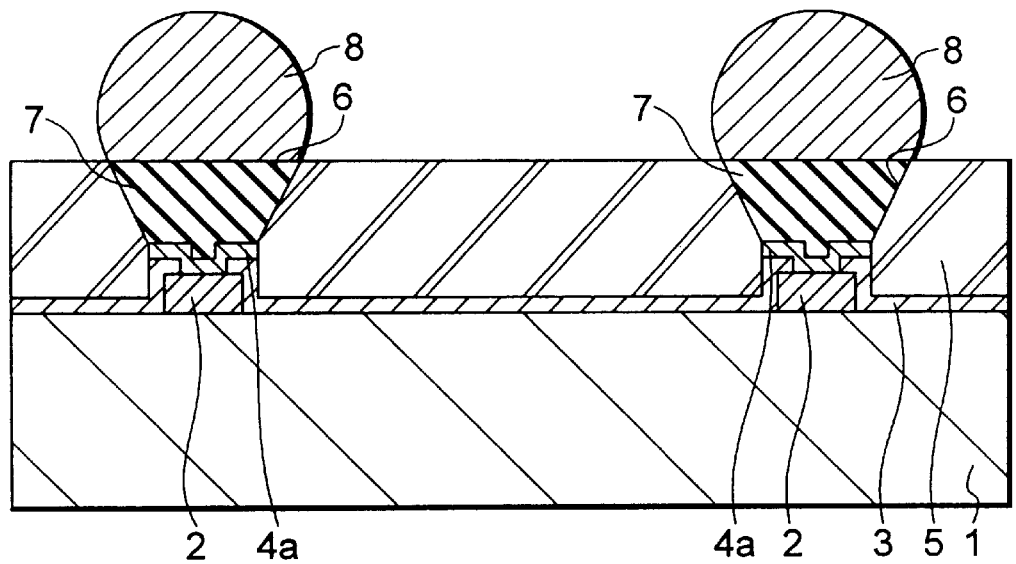
FIG. 3 is a cross section of a semiconductor device for explaining a second embodiment of the present invention.

In a second embodiment of the present invention, as shown in FIG. 3, so that only an area on an electrode pad 2 of a semiconductor substrate 1 is covered a layer of barrier metal 4a is formed, and a lead pattern is not formed. Thereafter, on the layer of barrier metal 4a a screen mask is disposed to form a hole 6 of inverse taper, and on a surface of a semiconductor substrate 1a covering layer 5 consisting of curable resin is formed by the use of screen-printing method. Thus, a covering layer 5 of curable resin having a hole 6 of inverse taper getting wider towards an opening edge, that is, upwards is formed.

Next, into the hole 6 of the covering layer 5 of curable resin, paste of eutectic solder is filled by the use of screen-printing method to form a lead portion 7 of electrode.

In the second embodiment, a layer of barrier metal 4a is formed only on an electrode pad 2. Accordingly, a layer of barrier metal 4a can be formed easily and manufacture of whole semiconductor device is also easily done. In addition, since there is no need of pulling around a lead pattern, reliability to a wiring of a layer of barrier metal 4a is improved. Further, since length of wiring can be shortened improvement of electrical performance such as lower inductance and higher speed is made possible.

Still further, according to the second embodiment, a hole 6 of a covering layer 5 of curable resin is formed with inverse taper getting wider towards an opening edge, eutectic solder can be easily filled into the hole 6 and a lead portion 7 of electrode can be easily formed.

Figure 4:
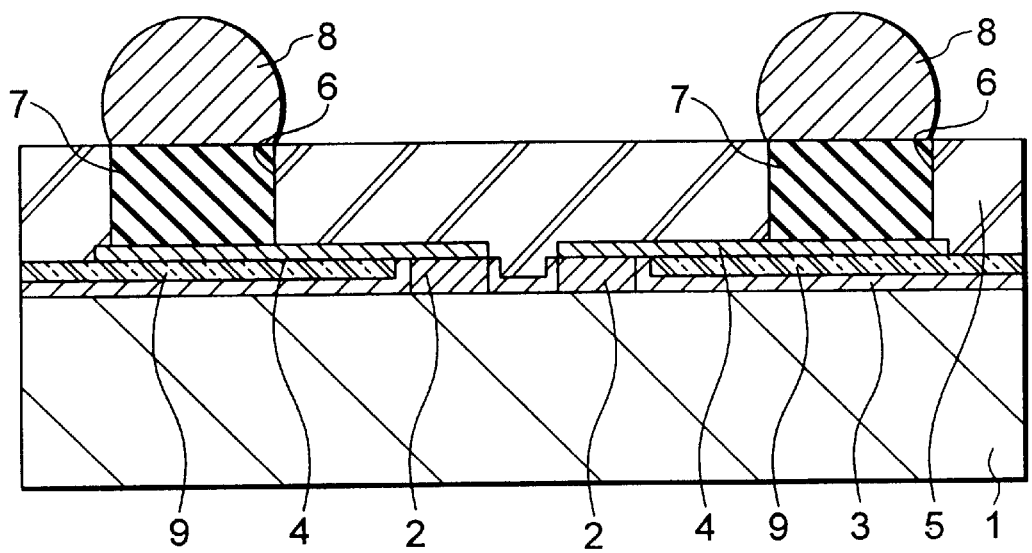
FIG. 4 is a cross section of a semiconductor device for explaining a third embodiment of the present invention.

In a third embodiment of the present invention, as shown in FIG. 4, after a layer of adhesive resin 9 is formed on the prescribed area on an insulating protective film 3, over from on an electrode pad 2 to on the layer of adhesive resin 9, a lead pattern 4 is formed by barrier metal. Incidentally, the layer of adhesive resin 9 is preferable to be formed by soft resin. Then, on this lead pattern 4, by the use of screen-printing method, a covering layer 5 of curable resin having a hole 6 on the prescribed position (on the lead pattern 4 formed on the layer of adhesive resin 9) is formed.

In the third embodiment, a layer of adhesive resin 9 is formed on an insulating protective layer 3 and thereon a lead pattern 4 of barrier metal is formed. Accordingly, in addition to enhancement of adhesiveness of the lead pattern 4 and improvement of electrical performance, the layer of adhesive resin 9 plays a role of stress-buffering material. Thereby, stress exerting on a semiconductor chip can be alleviated. Further, due to the layer of adhesive resin 9, electrical capacitance of a semiconductor device can be made smaller.

Figure 5:
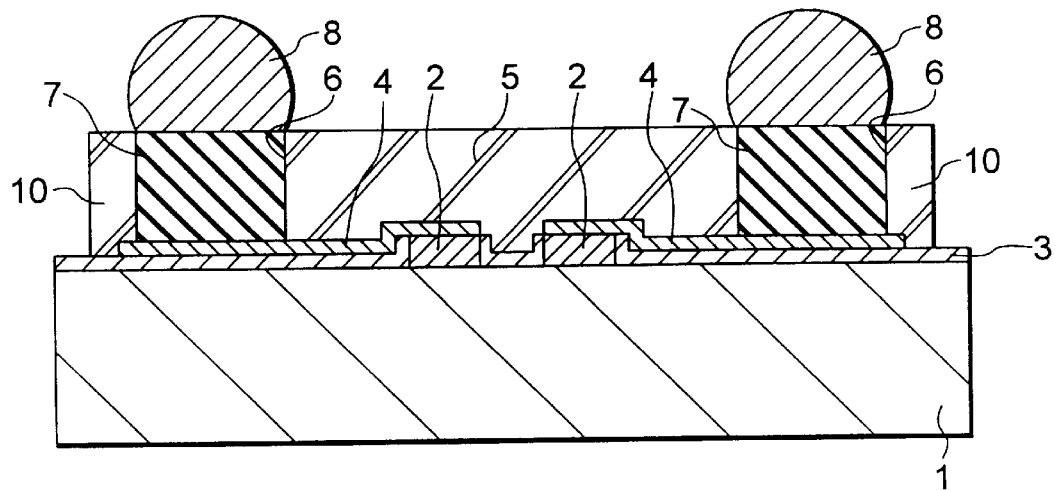
FIG. 5 is a cross section of a semiconductor device for explaining a fourth embodiment of the present invention.

In a fourth embodiment of the present invention, as shown in FIG. 5, on a covering layer 5 of curable resin, a groove 10 is formed along dicing line of a semiconductor substrate 1. The groove 10 can be formed, other than on the position that runs along the dicing line, on any places where wiring pattern does not exist. Further, other than forming a groove 10 after formation of a covering layer 5 of curable resin, simultaneously with formation of a covering layer 5 of curable resin a groove 10 also can be formed. That is, through adjustment of a pattern of an opening of a screen mask, a covering layer 5 of curable resin having a groove 10 at the prescribed position can be printed and formed.

In a semiconductor device manufactured according to the fourth embodiment, there does not occur shrinking force of curable resin at the groove 10, accordingly stress exerting on a semiconductor chip can be alleviated.

Figure 6:
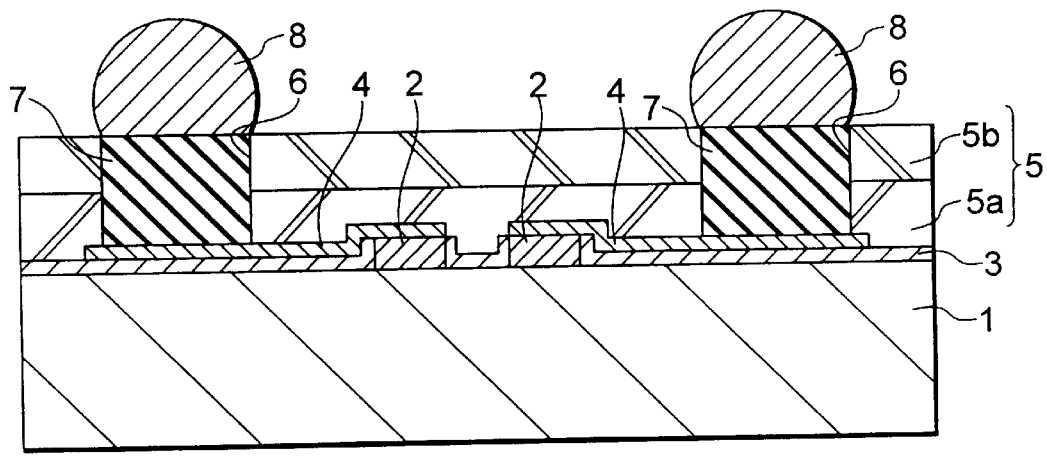
FIG. 6 is a cross section of a semiconductor device for explaining a fifth embodiment of the present invention.

Further, in a fifth embodiment of the present invention, as shown in FIG. 6, layers 5a and 5b consisting of different two kinds of curable resin are stacked to form a covering layer 5 of curable resin. That is, after a first layer 5a of curable resin having a hole 6 at a prescribed position is formed by the use of screen-printing method, by carrying out screen-printing with the same mask, a second layer of curable resin 5b having a hole 6 at the identical position is formed.

In a semiconductor device manufactured according to the fifth embodiment, stress is divided between the first layer 5a and the second layer 5b, accordingly thermal stress exerting on the semiconductor chip can be alleviated. Stacking number of layer of curable resin may be three or more. In this case also, as identical as the fifth embodiment, thermal stress exerting on a semiconductor chip can be alleviated.

As explained above, in the manufacturing method of a semiconductor device of the present invention, by a height of a lead portion 7 of electrode corresponding to a thickness of a covering layer 5 of curable resin a total height of an electrode for external connection can be made higher. Accordingly, thermal stress exerting on a semiconductor chip and a bump portion 8 of electrode can be alleviated.

Further, by forming electrodes for external connection or the like on a wafer (semiconductor substrate 1) and by finally cutting the semiconductor substrate 1 into each chip semiconductor devices are manufactured. Accordingly, since there is no need of assembling each semiconductor chip one by one, manufacturing process of semiconductor device can be simplified. In addition, a step of forming a covering layer 5 of curable resin on a surface of a semiconductor substrate 1 is carried out by the use of printing method such as screen-printing method. Accordingly, reduction of manufacturing cost and decrease of manufacturing steps are made possible.

While the invention has been particularly shown and described with reference to preferred embodiments thereof, it will be understood by those skilled in the art that various other changes in the form and details may be made therein without departing from the spirit and scope of the invention.

This invention is disclosed in Japanese Patent Application No. 10-202117 filed on Jul. 16, 1998, and the entire disclosure thereof is incorporated herein by reference.

What is claimed is:

1. A manufacturing method of a semiconductor device, comprising the steps of:

forming an electrode pad on a surface of a semiconductor substrate where a semiconductor element area is formed;

forming an insulating protective film on the surface of the semiconductor substrate except for on the electrode pad;

forming a layer of barrier metal that covers the electrode pad;

forming a covering layer consisting of curable resin that has a hole for exposing at least a part of the layer of barrier metal on the surface of the semiconductor substrate;

filling conductive material into the hole of the covering layer of curable resin, and forming a protrusion consisting of conductive material on the filled portion; and heating at least the protruded portion to form a protruded electrode for external connection.

2. The manufacturing method of a semiconductor device as set forth in claim 1:

wherein the covering layer of curable resin has a hole of inverse taper getting wider towards an opening edge.

3. The manufacturing method of a semiconductor device as set forth in claim 1:

wherein filling conductive material into the hole of the covering layer of curable resin and forming the protrusion using to conductive material are carried out in two separate steps.

4. The manufacturing method of a semiconductor device as set forth in claim 1:

wherein after formation of the insulating protective film, the layer of barrier metal is formed through a layer of adhesive resin on the insulating protective film.

5. The manufacturing method of a semiconductor device as set forth in claim 1:

wherein a plurality of semiconductor devices are formed simultaneously on a single semiconductor substrate.

6. The manufacturing method of a semiconductor device as set forth in claim 1:

wherein the covering layer consisting of curable resin is formed by stacking a plurality of layers of different kinds of curable resin.

7. The manufacturing method of a semiconductor device as set forth in claim 1:

wherein the covering layer consisting of curable resin is formed by the use of screen-printing method.

8. The manufacturing method of a semiconductor device as set forth in claim 1:

wherein paste of composite including powder of low melting metal is filled into the hole of the covering layer of curable resin.

9. A manufacturing method of a semiconductor device, comprising the steps of:

forming an electrode pad on a surface of a semiconductor substrate where a semiconductor element area is formed;

forming an insulating protective film on the surface of the semiconductor substrate except for on the electrode pad;

forming a lead pattern consisting of a metal having barrier property at least a part of which is connected to the electrode pad;

forming a covering layer consisting of curable resin that has a hole for exposing at least a part of the lead pattern on the surface of the semiconductor substrate;

filling conductive material into the hole of the covering layer of curable resin, and forming on this filled portion a protrusion consisting of conductive material; and heating at least the protruded portion to form a protruded electrode for external connection.

10. The manufacturing method of a semiconductor device as set forth in claim 9:

wherein the covering layer of curable resin has a hole of inverse taper getting wider towards an opening edge.

11. The manufacturing method of a semiconductor device as set forth in claim 9:

wherein filling conductive material into the hole of the covering layer of curable resin and forming the protrusion using conductive material are carried out in two separate steps.

12. The manufacturing method of a semiconductor device as set forth in claim 9:

wherein after formation of the insulating protective film, the lead pattern is formed through a layer of adhesive resin on the insulating protective film.

13. The manufacturing method of a semiconductor device as set forth in claim 9:

wherein a plurality of semiconductor devices are formed simultaneously on a single semiconductor substrate.

14. The manufacturing method of a semiconductor device as set forth in claim 9:

wherein the covering layer consisting of curable resin is formed by stacking a plurality of layers of different kinds of curable resin.

15. The manufacturing method of a semiconductor device as set forth in claim 9:

wherein the covering layer consisting of curable resin is formed by the use of screen-printing method.

16. The manufacturing method of a semiconductor device as set forth in claim 9:

wherein paste of composite including powder of low melting metal is filled into the hole of the covering layer of curable resin.

* * * * *

UNITED STATES PATENT AND TRADEMARK OFFICE
CERTIFICATE OF CORRECTION

PATENT NO. : 6,159,837
DATED : December 12, 2000
INVENTOR(S) : Yasuhiro Yamaji et al.

Page 1 of 1

It is certified that error appears in the above-identified patent and that said Letters Patent is hereby corrected as shown below:

<u>Claim 3, c</u>

Signed and Sealed this

Twenty-fifth Day of September, 2001

*Attest:*

*Attesting Officer*

NICHOLAS P. GODICI
Acting Director of the United States Patent and Trademark Office